United States Patent
Serrano Gotarredona et al.

(10) Patent No.: US 9,681,081 B2
(45) Date of Patent: Jun. 13, 2017

(54) TRANSIMPEDANCE GAIN CIRCUIT FOR TEMPORALLY DIFFERENTIATING PHOTO-SENSING SYSTEMS IN DYNAMIC VISION SENSORS

(75) Inventors: Teresa Serrano Gotarredona, Sevilla (ES); Bernabé Linares Barranco, Sevilla (ES)

(73) Assignee: CONSEJO SUPERIOR DE INVESTIGACIONES CIENTIFICAS (CSIC), Madrid (ES)

( * ) Notice: Subject to any disclaimer, the term of this patent is extended or adjusted under 35 U.S.C. 154(b) by 193 days.

(21) Appl. No.: 14/119,942

(22) PCT Filed: May 22, 2012

(86) PCT No.: PCT/ES2012/070363
§ 371 (c)(1),
(2), (4) Date: Feb. 24, 2014

(87) PCT Pub. No.: WO2012/160230
PCT Pub. Date: Nov. 29, 2012

(65) Prior Publication Data
US 2014/0231623 A1    Aug. 21, 2014

(30) Foreign Application Priority Data

May 26, 2011    (ES) .................................. 201130862

(51) Int. Cl.
*H04N 5/378*    (2011.01)
*H03F 3/345*    (2006.01)
(Continued)

(52) U.S. Cl.
CPC ............. *H04N 5/378* (2013.01); *H03F 1/086* (2013.01); *H03F 3/082* (2013.01); *H03F 3/345* (2013.01);
(Continued)

(58) Field of Classification Search
CPC .................................. H04N 3/15; G06T 1/00
(Continued)

(56) References Cited

U.S. PATENT DOCUMENTS 3,638,050 A    1/1972    Harp
5,155,353 A    10/1992    Pahr
(Continued)

FOREIGN PATENT DOCUMENTS

EP    1 357 665    10/2003
EP    1 381 223    1/2004
(Continued)

OTHER PUBLICATIONS

Patrick Lichtsteinner et al., "A 128×128 120 dB 15 μs Latency Asynchronous Temporal Contrast Vision Sensor", IEEE Journal of Solid-State Circuits, vol. 43, No. 2, Feb. 2008.
(Continued)

*Primary Examiner* — Renee Chavez
(74) *Attorney, Agent, or Firm* — Wenderoth, Lind & Ponack, L.L.P.

(57) ABSTRACT

The invention relates to a transimpedance gain circuit for temporally differentiating photo-sensing systems in dynamic vision sensors, which uses at least one photodiode and at least two in-series transistors, each of the transistors being connected in diode configuration and being positioned at the output of the photodiode. The output current from the photodiode flows through the drain-source channels of the transistors and the source of the last transistor in series is connected to a voltage selected from ground voltage, a constant voltage or a controlled voltage.

8 Claims, 3 Drawing Sheets

(51) Int. Cl.
    H03F 1/08         (2006.01)
    H03F 3/08         (2006.01)

(52) U.S. Cl.
    CPC .... *H03F 2200/456* (2013.01); *H03F 2200/91* (2013.01)

(58) Field of Classification Search
    USPC .............. 250/214 A; 348/300, 301; 330/308; 398/202, 206, 209, 213
    See application file for complete search history.

(56) References Cited

U.S. PATENT DOCUMENTS

| | | | | |
|---|---|---|---|---|
| 5,508,836 | A | * | 4/1996 | DeCaro .................. H04B 10/11 398/1 |
| 5,801,588 | A | | 9/1998 | Nishiyama |
| 6,194,695 | B1 | | 2/2001 | Barrows |
| 7,265,631 | B2 | * | 9/2007 | Kwa .......................... H03F 1/08 330/308 |
| 7,728,269 | B2 | | 6/2010 | Lichtsteiner et al. |
| 2003/0201382 | A1 | * | 10/2003 | Doh ..................... H03G 3/3084 250/214 AG |
| 2008/0173796 | A1 | | 7/2008 | Lum et al. |
| 2008/0237669 | A1 | | 10/2008 | Yanagisawa et al. |
| 2009/0001256 | A1 | | 1/2009 | Yanagisawa et al. |
| 2010/0116969 | A1 | | 5/2010 | Suzuki |
| 2010/0182468 | A1 | | 7/2010 | Posch et al. |

FOREIGN PATENT DOCUMENTS

| | | |
|---|---|---|
| GB | 2 424 138 | 9/2006 |
| WO | 2006/128315 | 12/2006 |

OTHER PUBLICATIONS

Teresa Serrano-Gotarredona et al., "A 128×128 1.5% Contrast Sensitivity 0.9% FPN 3 μs Latency 4 mW Asynchronous Frame-Free Dynamic Vision Sensor Using Transimpedance Preamplifiers," IEEE Journal of Solid-State Circuits, vol. 48, No. 3, Mar. 2013.

Christoph Posch et al., "ISSCC 2010/ Session 22/ Image Sensors/ 22.4, A QVGA 143dB Dynamic Range Asynchronous Address-Event PWM Dynamic Image Sensor with Lossless Pixel-Level Video Compression", 2010 IEEE International Solid-State Circuits Conference, 2010.

Christoph Posch et al., "A QVGA 143 dB Dynamic Range Frame-Free PWM Image Sensor With Lossless Pixel-Level Video Compression and Time-Domain CDS", IEEE Journal of Solid-State Circuits, vol. 46, No. 1, Jan. 2011.

P. Lichtsteiner et al., "ISSCC 2006/Session 27/Image Sensors/27.9, A 128×128 120dB 30mW Asynchronous Vision Sensor that Responds to Relative Intensity Change", 2006 IEEE International Solid-State Circuits Conference, 2006.

International Search Report issued Sep. 3, 2012 in International (PCT) Application No. PCT/ES2012/070363.

Charles G. Sodini. "Lecture 25: DC coupling, voltage/current sources and current sinks", May 15, 2007. Massachusetts Institute of Technology, Department of Electrical Engineering and Computer Science; Microelectronic Devices and Circuits, Spring 2007. [retrieved from Internet on Aug. 21, 2012]. <URL: http://web.mit.edu/6.012/www/SP07-L25.pdf>.

Charles G. Sodini. "Lecture 26: analyzing complex circuits, Wrap-up", May 17, 2007. Massachusetts Institute of Technology, Department of Electrical Engineering and Computer Science; Microelectronic Devices and Circuits, Spring 2007. [retrieved from Internet on Aug. 21, 2012]. <URL: http://web.mit.edu/6.012/www/SP07-L26.pdf>.

* cited by examiner

TRANSIMPEDANCE GAIN CIRCUIT FOR TEMPORALLY DIFFERENTIATING PHOTO-SENSING SYSTEMS IN DYNAMIC VISION SENSORS

OBJECT OF THE INVENTION

The present invention, as expressed in the present descriptive specification, refers to a transimpedance gain circuit for temporally differentiating photo-sensing systems in dynamic vision sensors (DVS), by means of transistors connected in diode.

The invention falls within the field of electronic circuits, especially low-consumption reduced-area analog integrated circuits. The circuit specifically pertains to the category of voltage current preamplifiers or in other words, transimpedance.

BACKGROUND OF THE INVENTION

Dynamic vision sensors (DVS) are new integrated circuits of the video camera variety, although they are not specifically such. In commercial video cameras, the apparatus records photogram after photogram. In DVS, there are no photograms. The integrated circuit contains a photo sensor matrix, similar to video cameras. In video cameras, each photo sensor is sampled with a fixed frequency. However, in DVS, the pixels are not sampled. Every pixel calculates the time derivative of the light it senses, and when this exceeds a certain level (threshold), the pixel emits an "event" outwards. The event usually consists of the (x,y) coordinate of the pixel within the two-dimensional photo sensor matrix. In this way, the output of a DVS consists of a flow of (x,y) coordinates of the various pixels that detect a change in the intensity they sense. This type of DVS sensor were reported for the first time by Lichtsteiner, Delbruck and Posch in 2006 ("A 128×128 120 dB 30 mW Asynchronous Vision Sensor that Responds to Relative Intensity Change" in Visuals Supplement to ISSCC Dig. Of Tech. Papers, San Francisco, 2006, vol., pp 508-509 (27.9) and subsequently in more detail in P. Lichtsteiner, C. Posch and T. Delbruck, ("A 128×128 120 dB 15 µs Latency Asynchronous Temporal Contrast Vision Sensor", *IEEE J. Solid-State Circuits*, vol. 43, No. 2, pp. 566-576, February 2008).

More recently, Posch has reported a new prototype (C. Posch, D. Matolin and R. Wohlgenannt, "A QGVA 143 dB dynamic range asynchronous address-event PWM dynamic image sensor with lossless pixel level video-compression", *Solid-State Circuits, 2010 IEEE International Conference ISSCC, Dig of Tech Paper*, pp. 400-401, February 2010).

However, in these DVS sensors, the photocurrent $I_{ph}$ sensed by a photo sensor is firstly transformed into voltage by means of a logarithmic conversion. This voltage is firstly amplified and its time derivative subsequently calculated. A crucial parameter is the voltage gain in this first amplification. The greater the amplification, the more sensitive the sensor will be to the "Temporal Contrast". The problem is that this amplification should be carried out within each pixel of the matrix and should be carried out by a circuit which consumes little power and little area in the microchip. Moreover, it is important that it is carried out by a circuit which does not undergo too much mismatch in the gain value from one pixel to another, given that in the contrary case, it would introduce much variation into the behavior of the various pixels in comparison to one another, thereby reducing the overall sensitivity of the sensor. The DVS reported to date employ voltage amplification stages based on circuits with capacitors. In integrated analog circuits, the capacitors have low-mismatch between one another and are therefore highly suitable for carrying out voltage amplification stages. However, in DVS, obtaining voltage gains of around 20 to 100 (or over) is desirable. Upon doing so with capacitors, at least two capacitors are required, the value proportion of which is equal to that of the desired gain. Given that the area of the capacitors is proportional to their value this means that one of the capacitors should have an area which is between 20 and 100 times greater than the other. The end result is that a large part of the area of the pixel is consumed in the capacitors.

A possible alternative may be to obtain the voltage gain by means of two consecutive stages, given that the gain of each stage is multiplied. However, the synchronisation required between the two consecutive stages also makes it too long, thus reducing the speed of the DVS dramatically.

DESCRIPTION OF THE INVENTION

In order to achieve the objectives and avoid the limitations set out above, the present invention consists of a transimpedance gain circuit for temporally differentiating photo-sensing systems in dynamic vision sensors (DVS), by means of transistors connected in diode.

Therefore, the present invention refers to a transimpedance gain circuit for temporally differentiating photo-sensing systems in dynamic vision sensors (DVS), which employs at least one photodiode, the system being characterized in that it comprises at least two in-series transistors, each one of the transistors being connected in diode configuration and being positioned at the output of the photodiode, the output current of the photodiode flowing through the drain-source channels of the transistors and the source of the last in-series transistor being connected to a voltage selected from an ground voltage, a constant voltage and a controlled voltage. Therefore, the pixels of the cameras which make use of dynamic vision sensors, also known as DVS cameras, need at least one photosensor to generate the input current to the transimpedance circuit. However, if the circuit is used in another context, the input current may come from another circuit or element which is not a photodiode. In fact, when several of these stages are used in cascade, for example, only the first one receives the current from the photodiode; the rest receive it from a transistor.

In a preferred embodiment of the invention, the at least two transistors have an exponential voltage-current characteristic.

In another preferred embodiment of the invention, the transistors are of the FET (field-effect transistor) variety, being biased in weak inversion.

In a further preferred embodiment of the invention, the circuit comprises a number of means for controlling the polarity of the electrical current generated in the photodiode, the means for controlling the polarity are positioned between the photodiode and the at least two transistors. These means for controlling the polarity are optional and improve the output of the circuit by obtaining a faster circuit response.

In an additional embodiment of the invention, the means for controlling the polarity comprise electrical current copying and inversion means.

In another preferred embodiment of the invention, the means for controlling polarity comprise electrical current amplification means.

In an additional further embodiment of the invention, the means for controlling the polarity are a current mirror in series with the photodiode, the output current of the means for controlling the polarity constituting that which flows through the drain-source channels of the at least two transistors.

In another preferred embodiment of the invention, the circuit comprises a circuit for automatically controlling the gain of the current mirror between the current mirror and the at least two transistors.

In a further preferred embodiment of the invention, the current comprises having logarithmic dependence between the output voltage, in comparison to the current generated by the photodiode.

In addition, the present invention considers the use of the transimpedance gain circuit for temporally differentiating photo-sensing systems in DVS for generating a voltage amplification stage by means of positioning the transimpedance gain circuit as a stage prior to a transconductance circuit.

The present invention also comprises the use of the transimpedance gain circuit for temporally differentiating photo-sensing systems in DVS to generate a voltage amplification stage by means of positioning the transimpedance gain circuit as a stage subsequent to a transconductance circuit.

Furthermore, the present invention also comprises the use of the transimpedance gain circuit for temporarily differentiating photo-sensing systems in DVS as a stage prior to a signal derivative circuit for sending the signal to the output which eliminates the continuous voltage of the output signal of the transimpedance gain circuit, thereby reducing mismatch between all of the pixels.

DESCRIPTION OF VARIOUS EXAMPLE EMBODIMENTS OF THE INVENTION

Below is an illustrative and non-limiting description of various particular embodiments of the invention, making reference to the numbering adopted in the figures.

In the present invention, the circuit that transforms the photocurrent to a voltage, by means of a logarithmic conversion, carries out, implicitly, a voltage amplification with low mismatch of the gain between the various pixels within the same microchip.

Figure 1:
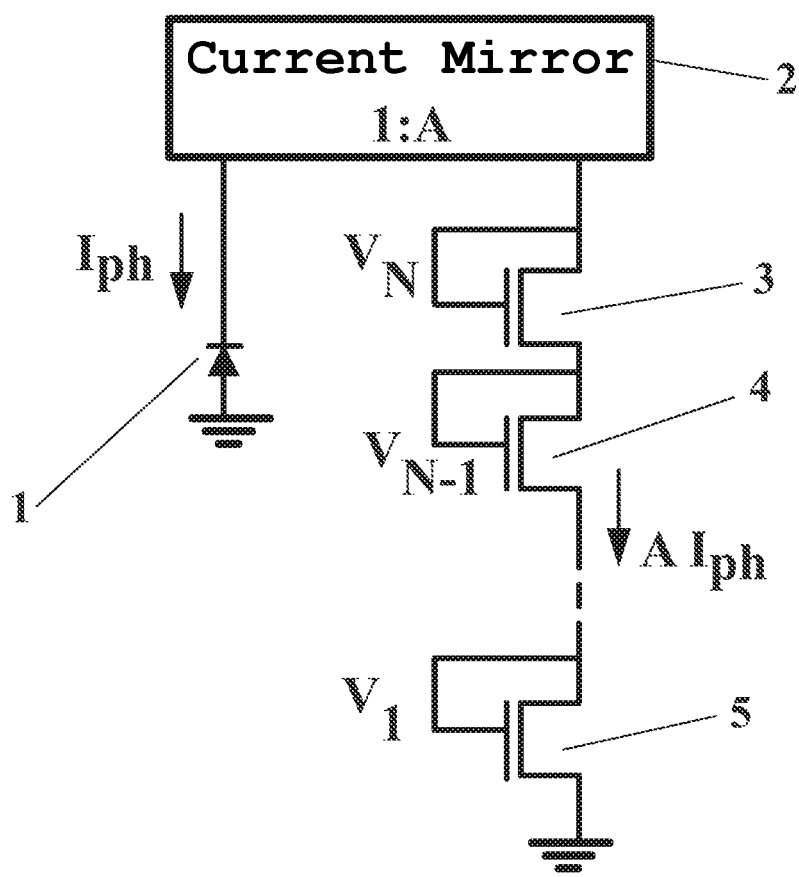
FIG. 1 is an example of an embodiment of the present invention, comprising one single stage.

Therefore, FIG. 1 shows the most basic embodiment of the circuit, object of the invention. The particular embodiment comprises a photodiode (1), which generates a photocurrent $I_{ph}$, which is amplified by means of a current mirror (2) having a gain A. The amplified current leads to a chain of N transistors (3, 4 and 5), N being a natural number, all of which have connected their gate to their drain, which is known by connection in diode configuration. Please note that FIG. 1 shows 3 transistors, which may in reality be any number N of transistors.

In the event of an embodiment with NMOS FET transistors, the voltage difference formed in each transistor (3, 4 and 5), biased in weak inversion, is approximately the same and equals $$V = nU_T \ln\left(\frac{AI_{ph}}{I_g}\right)$$

In this way, the voltage obtained in the highest transistor is approximately $$V_N = NnU_T \ln\left(\frac{AI_{ph}}{I_g}\right)$$

In an embodiment of the integrated circuit, the parameters A, corresponding to the gain of the current mirror and $I_g$ corresponding to a parameter characteristic of the FET transistor, usually referred to as "specific current", undergo great variation from pixel to pixel, whilst $U_T$ is an equal physical constant for all the pixels. The parameter n, corresponding to a further parameter characteristic of the FET transistor usually known as "slope factor" undergoes a relatively low variation from pixel to pixel. When the output voltage $V_N$ is taken to the derivative circuit, it provides the output $$\frac{dV_N}{dt} = NnU_T \frac{I'_{ph}}{I_{ph}}$$

In such a way that this circuit adds the N factor (N being the number of transistors in each stage) to the gain obtained by means of previous techniques and the parameters which undergo great mismatch from pixel to pixel A and $I_g$ do not intervene.

Figure 2:
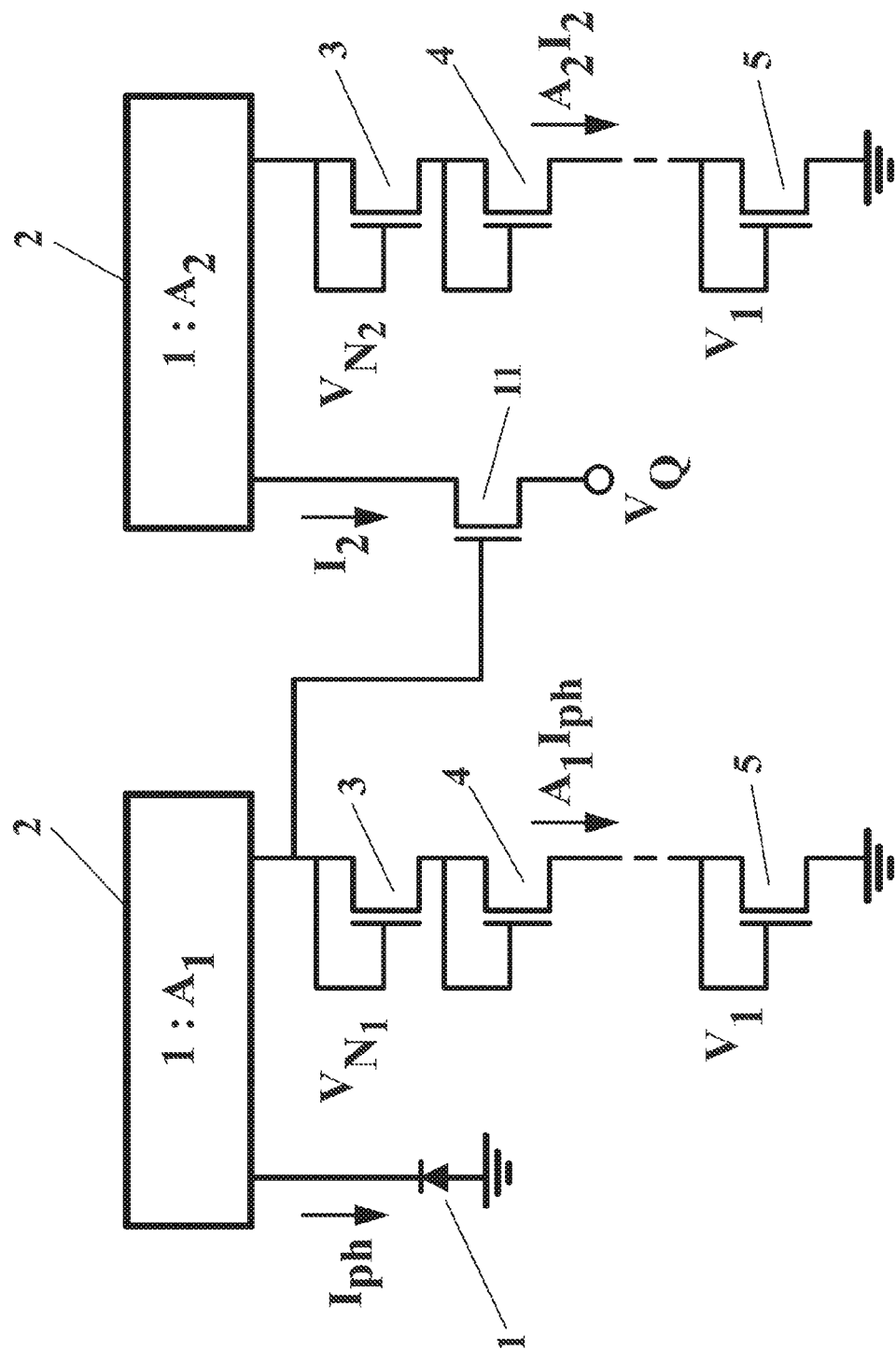
FIG. 2 is an example of an embodiment of the invention, wherein the circuit is composed of two stages.

In practice it is not possible to use very high N values, being limited to 3 or 4. However, it is possible to connect different stages in cascade, like those shown in FIG. 1. This is shown in FIG. 2, where the first stage has $N_1$ in-series transistors and the second stage has $N_2$.

The voltage formed in the first block $V_{N1}$ (3) is carried to the gate of a transistor (11) with the source connected to $V_Q$, generating a current $$I_2 = I_{s2} e^{\frac{V_{N2} - nV_Q}{nU_T}}$$

Upon deriving the output from the circuit $V_{N1}$, the following approximate result is obtained:

$$\frac{dV_{N2}}{dt} = N_1 N_2 nU_T \frac{I'_{ph}}{I_{ph}}$$

Once again, the parameters of high mismatch index between pixels do not appear in the final equation. This method makes it possible to expand to more successive stages.

Figure 3:
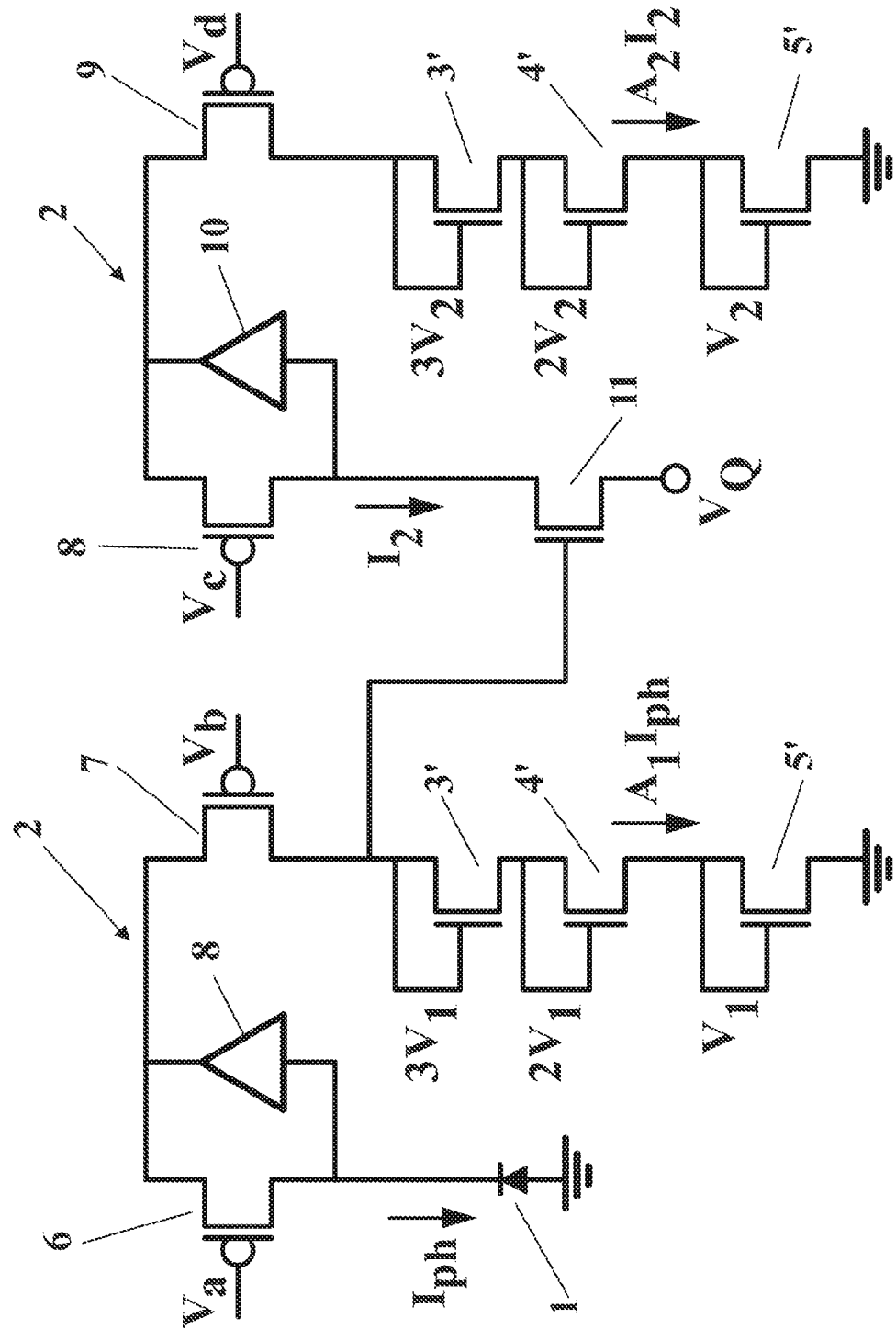
FIG. 3 is an example of an embodiment in the circuit, wherein the circuit comprises having two stages, each one of which has a gain equal to "3".

FIG. 3 shows an exemplary embodiment with two stages, each one contributing an additional gain "3". It shows a possible embodiment of the current mirrors. In order to achieve the additional gain, 3 FET transistors (3', 4' and 5') have been employed in cascade in each one of the steps. A FET transistor (11) is positioned at the input of the second stage with the source connected to a voltage $V_Q$ in order to generate the current $I_2$.

The current mirrors are basic circuits well known in literature on analog integrated circuit design. These copy the current in its input branch to the output branch, giving to the output branch an optional amplification or attenuation. In FIG. 3, the current mirror of the first stage is formed by three elements, two PMOS FET transistors (6, 7) being with their gate connected to respective constant voltage $V_a$ and $V_b$ and a voltage amplifier (8) with a gain which is high enough to generate the "virtual ground" conditions in the node that joins the photodiode (1) to the first PMOS transistor (6), thus improving the velocity of the circuit noticeably. The current mirror of the second stage (8, 9 and 10) is identical to that of the first stage, although it may be biased with different voltages $V_c$ and $V_d$, which would give rise to a different gain.

These circuits, which are repeated for each pixel, should be complemented by a number of biasing circuits, shared between all the pixels, in order to fix the voltages $V_a$, $V_b$, $V_c$, $V_d$ and $V_Q$.

In the specific case of using DVS cameras, at least one photodiode is required to capture light in each pixel. Therefore, in each pixel of the DVS camera, there would be a transimpedance stage (or stages in cascade).

If the stage is used in a context other than that of the DVS cameras, the input current may come from another circuit which is not a photodiode. In fact, for example, when several of these stages are used in cascade, only the first receives the current from the diode. The rest receive it from a transistor.

The invention claimed is:

1. A transimpedance gain circuit for temporally differentiating photo-sensing systems in dynamic vision sensors, which employs at least one photodiode, wherein the transimpedance gain circuit comprises:
   at least two in-series transistors, each one of the at least two in-series transistors being connected in diode configuration and being positioned at an output of the at least one photodiode; and
   a current mirror configured to control polarity of a current generated by the at least one photodiode, wherein the current mirror comprises electric current copying and inversion means and electric current amplification means, and wherein the current mirror is positioned between the at least one photodiode and the at least two in-series transistors, wherein
   the at least two in-series transistors are configured to be fed by an output current of the current mirror, which is a copy of the current generated by the at least one photodiode, such that the output current of the current mirror flows through drain-source channels of the at least two in-series transistors, and wherein the last in-series transistor of the at least two in-series transistors has a source connected to a voltage selected between a ground voltage, a constant voltage and a controlled voltage.

2. The transimpedance gain circuit according to claim 1, wherein the at least two in-series transistors have an exponential type current-voltage characteristic.

3. The transimpedance gain circuit according to claim 1, wherein the at least two in-series transistors are FET transistors biased in weak inversion.

4. The transimpedance gain circuit according to claim 1, wherein the transimpedance gain circuit comprises a biasing circuit for automatically controlling a gain of the current mirror, said biasing circuit being positioned between the current mirror and the at least two in-series transistors.

5. The transimpedance gain circuit according to claim 1, wherein a logarithmic dependence exists between an output voltage versus the current generated by the at least one photodiode.

6. A current amplification stage comprising the transimpedance gain circuit according to claim 1, and a transconductance circuit connected at an output of the transimpedance gain circuit.

7. A voltage amplification stage comprising the transimpedance gain circuit according to claim 1, and a transconductance circuit, the transimpedance gain circuit being connected at an output of the transconductance circuit.

8. A method of reducing mismatch among pixels, the method comprising providing a transimpedance gain circuit, and
   connecting the transimpedance gain circuit to a derivative circuit;
   introducing an input signal; and
   eliminating a continuous voltage of the input signal at an output of the transimpedance gain circuit, wherein
   the transimpedance gain circuit employs at least one photodiode, wherein the transimpedance gain circuit comprises:
   at least two in-series transistors, each one of the at least two in-series transistors being connected in diode configuration and being positioned at an output of the at least one photodiode; and
   a current mirror configured to control polarity of a current generated by the at least one photodiode, wherein the current mirror comprises electric current copying and inversion means and electric current amplification means, and wherein the current mirror is positioned between the at least one photodiode and the at least two in-series transistors,
   wherein the at least two in-series transistors are configured to be fed by an output current of the current mirror which is a copy of the current generated by the at least one photodiode, such that the output current of the current mirror flows through drain-source channels of the at least two in-series transistors, and wherein the last in-series transistor of the at least two in-series transistors has a source connected to a voltage selected between a ground voltage, a constant voltage and a controlled voltage.

\* \* \* \* \*